United States Patent
Gates et al.

(10) Patent No.: US 9,349,687 B1
(45) Date of Patent: May 24, 2016

(54) ADVANCED MANGANESE/MANGANESE NITRIDE CAP/ETCH MASK FOR AIR GAP FORMATION SCHEME IN NANOCOPPER LOW-K INTERCONNECT

(71) Applicant: International Business Machines Corporation, Armonk, NY (US)

(72) Inventors: Stephen M. Gates, Ossining, NY (US); Elbert E. Huang, Carmel, NY (US); Joe Lee, Albany, NY (US); Son V. Nguyen, Schenectady, NY (US); Brown C. Peethala, Albany, NY (US); Christopher J. Penny, Saratoga Springs, NY (US); Deepika Priyadarshini, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/975,725

(22) Filed: Dec. 19, 2015

(51) Int. Cl.
*H01L 21/768* (2006.01)
*H01L 23/528* (2006.01)
(Continued)

(52) U.S. Cl.
CPC .......... *H01L 23/528* (2013.01); *H01L 21/3081* (2013.01); *H01L 21/7682* (2013.01); *H01L 21/7685* (2013.01); *H01L 21/76865* (2013.01); *H01L 23/5329* (2013.01);
(Continued)

(58) Field of Classification Search
CPC .................... H01L 21/76832; H01L 21/76837
USPC ........................................... 257/760; 438/624
See application file for complete search history.

(56) References Cited

U.S. PATENT DOCUMENTS

2007/0218677 A1 9/2007 Engelhardt et al.
2012/0319279 A1* 12/2012 Isobayashi .......... H01L 23/4821
257/751
(Continued)

FOREIGN PATENT DOCUMENTS

TW 201234421 A1 8/2012
WO 2005/034200 A2 4/2015
WO 2015/094667 A1 6/2015

OTHER PUBLICATIONS

Park, S., "Materials, Processes, and Characterization of Extended Air-gaps for the Intra-level Interconnection of Integrated Circuits", A Dissertation Presented to The Academic Faculty, May 2008, Georgia Institute of Technology, pp. 1-155.
(Continued)

*Primary Examiner* — George Fourson, III
(74) *Attorney, Agent, or Firm* — Scully, Scott, Murohy & Presser, P.C.; Daniel P. Morris, Esq.

(57) ABSTRACT

After forming a manganese (Mn)-containing cap layer over interconnects embedded in an interlevel dielectric (ILD) layer, a lithographic stack is formed over the Mn-containing cap layer. The lithographic stack is subsequently patterned to expose a portion of the Mn-containing cap layer that overlies a subset of the interconnects between which the air gaps are to be formed. A portion of the ILD layer located between the subset of the interconnects is damaged through the exposed portion of the Mn-containing cap layer. The damaged portion of the ILD layer is subsequently removed to form openings between the subset of the interconnects. The Mn-containing cap layer acts as a temporary protection layer preventing erosion of the underlying interconnects during the air gap formation.

20 Claims, 5 Drawing Sheets

(51) Int. Cl.
*H01L 29/06* (2006.01)
*H01L 23/532* (2006.01)
*H01L 21/308* (2006.01)

(52) U.S. Cl.
CPC ..... *H01L 23/53261* (2013.01); *H01L 29/0649* (2013.01); *H01L 21/76832* (2013.01); *H01L 21/76837* (2013.01)

(56) References Cited

U.S. PATENT DOCUMENTS

| | | |
|---|---|---|
| 2013/0175693 A1 | 7/2013 | Kim et al. |
| 2014/0054670 A1 | 2/2014 | Lee et al. |
| 2015/0108646 A1 | 4/2015 | Chae et al. |
| 2015/0108647 A1 | 4/2015 | Zhang et al. |
| 2015/0170956 A1 | 6/2015 | Naik et al. |
| 2015/0171003 A1* | 6/2015 | Morita ................. H01L 21/768 257/784 |
| 2015/0235943 A1* | 8/2015 | Suzumura ......... H01L 23/53295 257/774 |
| 2015/0287628 A1* | 10/2015 | You .................... H01L 21/7682 257/774 |
| 2015/0311151 A1* | 10/2015 | Chi ................... H01L 21/76802 257/773 |
| 2015/0380302 A1* | 12/2015 | Mountsier ......... H01L 21/76831 438/654 |
| 2016/0020140 A1* | 1/2016 | Ryan ................. H01L 21/76802 438/666 |

OTHER PUBLICATIONS

Zhang, X. et al., Mechanical Stability of Air-gap Interconnects, Future Fab International, Back End of Line, Issue 27, (2008), pp. 81-87.

Takigawa, Y., et al., "Novel Air-gap Formation Technology Using Ru Barrier Metal for Cu Interconnects with High Reliability and Low Capacitance", Japanese Journal of Applied Physics 50 (2011), pp. 016503-1 to 016503-6.

* cited by examiner

ADVANCED MANGANESE/MANGANESE NITRIDE CAP/ETCH MASK FOR AIR GAP FORMATION SCHEME IN NANOCOPPER LOW-K INTERCONNECT

BACKGROUND

The present application relates to fabrication of interconnects having air gaps, and more particularly to structures and methods for preventing erosion of interconnects during an air gap formation process.

Integrated circuits (ICs) commonly use copper (Cu) interconnects to connect semiconductor devices such as, for example, transistors, on the ICs. As scaling of the IC chips continues, the distance between the adjacent interconnects decreases, and thus the resulting capacitance, which is a function of the dielectric constant (k value) of the insulating material divided by the distance between the adjacent interconnects, increases. This increased capacitance leads to increased capacitive coupling between the interconnects, thereby increasing power consumption and limiting the device speed. The use of an air gap between interconnects has been explored to reduce interconnect capacitance. However, all of the current airgap formation schemes run the risk of significant Cu erosion, which presents reliability issues. Therefore, a method that can effectively prevent erosion of interconnects during air gap formation remains needed.

SUMMARY

The present application provides a method to prevent erosion of interconnects during an air gap formation process. After forming a manganese (Mn)-containing cap layer over the interconnects embedded in an interlevel dielectric (ILD) layer, a lithographic stack is formed over the Mn-containing cap layer. The lithographic stack is subsequently patterned to expose a portion of the Mn-containing cap layer that overlies a subset of the interconnects between which the air gaps are to be formed. A portion of the ILD layer located between the subset of the interconnects is damaged through the exposed portion of the Mn-containing cap layer. The damaged portion of the ILD layer is subsequently removed to form openings between the subset of the interconnects. The Mn-containing cap layer acts as a temporary protection layer preventing erosion of the underlying interconnects during the air gap formation process.

In one aspect of the present application, a semiconductor structure is provided. The semiconductor structure includes a plurality of interconnects embedded in an interlevel dielectric (ILD) layer. An air gap is located between adjacent interconnects in a first subset of the plurality of interconnects. The semiconductor structure further includes a manganese-containing cap layer portion located over the ILD layer and a second subset of the plurality of interconnects as well as a dielectric cap layer located over the first subset of the plurality of the interconnects and the manganese-containing cap layer portion. The dielectric cap layer seals the air gap between the adjacent interconnects in the first subset of the plurality of interconnects.

In another aspect of the present application, a method of forming semiconductor structure is provided. The method includes forming a plurality of interconnects embedded in an interlevel dielectric (ILD) layer. A manganese-containing cap layer is then formed over the ILD layer and the plurality of interconnects. Next, a first hard mask layer portion is formed over a portion of the manganese-containing cap layer that overlies a subset of the plurality of interconnects. After damaging a portion of the ILD layer underlying another portion of the manganese-containing cap layer that is not covered by the first hard mask layer portion, the another portion of the manganese-containing cap layer and the damaged portion of the ILD layer are removed to form openings between the interconnects in the subset of the plurality of interconnects. Next, a dielectric cap layer is formed over the openings and the portion of the manganese-containing cap layer to pinch off the openings.

DETAILED DESCRIPTION

Figure 1:
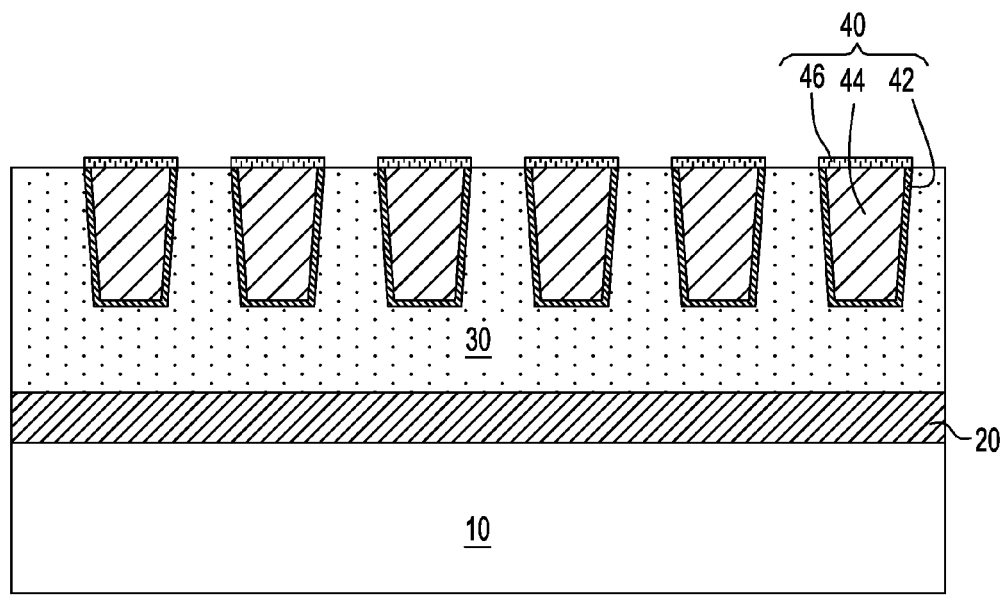
FIG. 1 is a cross-sectional view of an exemplary semiconductor structure including interconnects formed within an interlevel dielectric (ILD) layer according to an embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure according to one embodiment of the present application includes interconnects 40 formed within an interlevel dielectric (ILD) layer 30 that is located over a material stack. In one embodiment and as shown in FIG. 1, the material stack includes, from bottom to top, a substrate 10 and a first dielectric cap layer 20.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include metal lines and/or metal via structures embedded within at least one dielectric material layer. The top surface of the substrate 10 can be planar, or can have a non-planar topography.

In some embodiments, the first dielectric cap layer 20 is employed to protect the underlying substrate 10 from impurities that may diffuse down from upper levels. The first dielectric cap layer 20 may also function as a diffusion barrier layer that prevents vertical diffusion of metallic impurities, moisture, or other gaseous impurities. The first dielectric cap layer 20 may include, for example, silicon nitride, silicon carbide, nitrogen and hydrogen doped silicon carbide (SiCNH), nitrogen, oxygen and hydrogen doped silicon carbide (SiCNOH) or a combination thereof. The first dielectric cap layer 20 may be formed, for example, by chemical vapor deposition (CVD) or atomic layer deposition (ALD). The thickness of the first dielectric cap layer 20 can be from 5 nm to 50 nm, although lesser and greater thicknesses can also be employed. The first dielectric cap layer 20 is optional and can be omitted in some embodiments of the present application.

The ILD layer 30 can include any dielectric material that can embed metal interconnects. For example, the ILD layer 30 can include a low-k dielectric material. By "low-k" it is meant a dielectric material having a dielectric constant that is about 3.9 or less. Exemplary low-k dielectric materials include, but are not limited to dense or porous organosilicates, silsequioxanes, undoped silicate glass (USG), fluorosilicate glass (FSG), borophosphosilicate glass (BPSG), hydrogenated oxidized silicon carbon (SiCOH), carbon rich SiCNH and silicon oxynitride (SiNO). The ILD layer 30 may be formed by CVD, plasma enhanced chemical vapor deposition (PECVD) or spin coating. The thickness of the ILD layer 30 may be from 40 nm to 1,000 nm, although lesser and greater thicknesses can also be employed.

Each of the interconnects 40 includes a diffusion barrier 42 that contacts surfaces of the ILD layer 30 and a conductive structure 44 that fills a cavity within the diffusion barrier 42.

The interconnects 40 can be formed by first patterning the ILD layer 30 utilizing lithography and etching processes known in the art to provide openings (not shown) within the ILD layer 30. The openings may be via openings, line openings, or combinations of via and line openings. In some embodiments, the combined via and line opening may be formed one directly atop the other such that the two openings are in electrical communication with each other.

The lithography step includes forming a photoresist layer (not shown) atop the ILD layer 30 utilizing CVD, PECVD, spin coating or evaporation. Following formation of the photoresist layer, the photoresist layer is exposed to a desired patterned of radiation. The exposed photoresist layer is developed utilizing a conventional resist develop process. After the development step, an etching step is performed to transfer the pattern from the patterned photoresist layer into the ILD layer 30. The etching step used in forming the openings can include a dry etch such as, for example, reactive ion etching (RIE), a wet etch or a combination thereof. Typically, RIE is used to form the openings. After the pattern is transferred into the ILD layer 30, the patterned photoresist layer can be removed via a conventional stripping process such as, for example, ashing.

Next, a diffusion barrier layer (not shown) is formed on the exposed surfaces of the openings and the top surface of the ILD layer 30. The diffusion barrier layer may include Ta, TaN, TiN, Ru, RuN, RuTa, RuTaN, IrTa, IrTaN, W, WN, or any other material that can serve as a barrier to prevent the conductive material from diffusing therethrough. The diffusion barrier layer may be formed by a conventional deposition process including, for example, CVD, PECVD, ALD, physical vapor deposition (PVD), sputtering or chemical solution deposition. The diffusion barrier layer that is formed may have a thickness from 2 nm to 40 nm, although lesser and greater thicknesses can also be employed.

After lining the openings with the diffusion barrier layer, a conductive material layer (not shown) is deposited on the diffusion barrier layer. The conductive material layer is deposited to a thickness such that the openings are completely filled by the conductive material layer. The conductive material layer may include, for example, Cu, Al, W or Co or a Cu alloy such as AlCu or CuMn. The conductive material layer may be deposited utilizing a conventional deposition process including, but not limited to, CVD, PECVD, sputtering, chemical solution deposition or plating.

After deposition, a conventional planarization process such as, for example, chemical mechanical polishing (CMP) can be performed to remove portions of the conductive material layer and the diffusion barrier layer that are located above the top surface of the ILD layer 30 to provide the diffusion barriers 42 which are remaining portions of the diffusion barrier layer and the conductive structures 44 which are remaining portions of the conductive material layer. Each of the diffusion barriers 42 and the conductive structures 44 has an upper surface that is coplanar with the top surface of the ILD layer 30.

In some embodiments of the present application, each of the interconnects 40 further includes a metal cap 46 located on top of the diffusion barrier 42 and the conductive structure 44. The metal caps 46 may include a metal that has a high affinity for oxygen. By "high affinity for oxygen" it is meant that the meal caps 46 include a metal that has a higher metal oxide formation energy as compared to the metal in the conductive structures 44. For example, the metal caps 46 may include a noble metal such as Co, W, Ru, Rh, Pt, or alloys thereof.

In one embodiment of the present application, a selective deposition process is used to form the metal caps 46. During the selective deposition process, the metal is deposited only on metallic surfaces such as top surfaces of the diffusion barriers 42 and the conductive structures 44, but not on dielectric surfaces such as the top surface of the ILD layer 30. The metal caps 46 thus formed are substantially aligned with the metal features, i.e., the diffusion barriers 42 and the conductive structures 44, and do not extend onto the top surface of the ILD layer 30. Examples of selective deposition processes that can be employed in the present application in forming the metal caps 46 include, but are not limited to, selective CVD, selective ALD, or electroless plating.

In another embodiment of the present application a non-selective deposition is employed to form the metal caps 46. The metal caps 46 thus formed can extend onto the top surface of the ILD layer 30 (not shown).

The thickness of the metal caps 46 may vary depending on the type of metal present in the metal caps 46, as well as the deposition technique and conditions employed. Typically, the metal caps 46 have a thickness from 3 nm to 10 nm, with a thickness from 0.5 nm to 3 nm being more typical. The metal caps 46 are optional and can be omitted in some embodiments of the present application.

Figure 2:
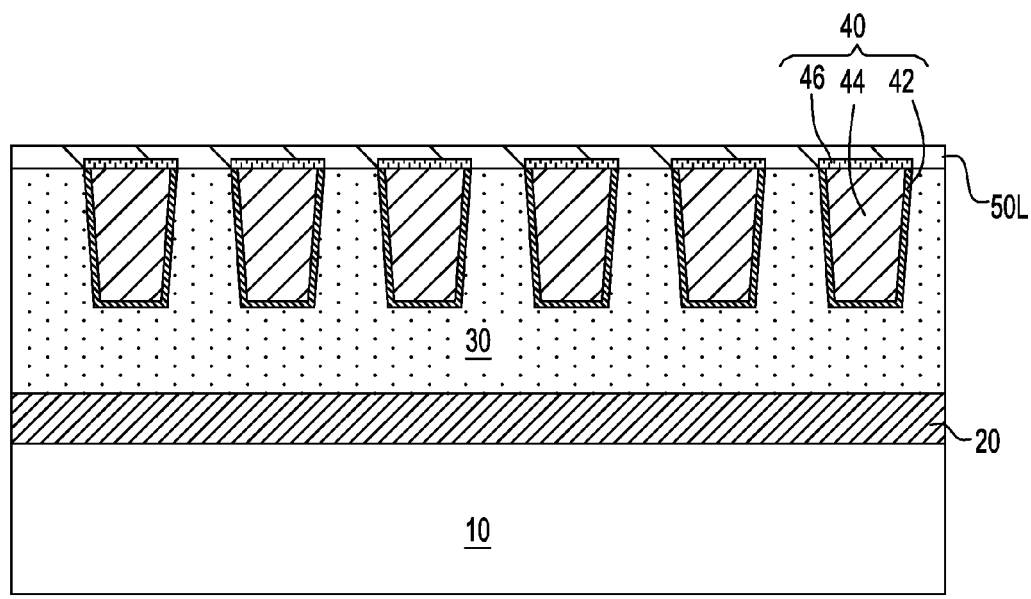
FIG. 2 is a cross-sectional view of the exemplary semiconductor structure of FIG. 1 after forming a manganese (Mn)-containing cap layer over the ILD layer and the interconnects.

Referring to FIG. 2, a manganese (Mn)-containing cap layer 50L is formed over the ILD layer 30 and the interconnects 40. The Mn-containing cap layer 50L acts as an etch stop layer preventing erosion of the underlying interconnects 40 during the subsequent fabrication processes in formation of air gaps between the interconnects 40. In addition, Mn in the Mn-containing cap layer 50L can also react with the underlying ILD layer 30 to form manganese silicates which function as a good diffusion barrier for the conductive materials in the conductive structures 44. The manganese silicate can be, for example, $MnSiCOH_x$ or $MnSiCNO_x$.

The Mn-containing cap layer 50L may be a layer of manganese nitride ($MnN_x$) or a bilayer of $Mn/MnN_x$, with x in the range of 0.05 to 3. The $MnN_x$ layer can be deposited utilizing any suitable techniques including ALD or CVD. In one embodiment, the $MnN_x$ layer can be deposited by ALD using an organometallic precursor, such as a manganese silyl amido complex. In another embodiment, the $MN_x$ layer can be deposited by CVD in which the manganese precursor and nitriding agent are coflowed into the processing chamber and allowed to react in the gas phase. In yet another embodiment, the $MnN_x$ layer can be formed by first depositing a layer of Mn over the ILD layer 30 and the interconnects 40 followed by annealing the structure in an $NH_3$ or $N_2/H_2$ atmosphere or exposing the structure to $NH_3/N_2$ plasma so as to convert Mn into MnNx through nitridation. The bilayer of $Mn/MnN_x$ can be formed by sequentially depositing a Mn layer and a $MnN_x$ layer over the ILD layer 30 and the interconnects 40 as discrete layers by, for example, ALD, or by depositing a Mn layer and subsequently converting a surface portion of the Mn layer into $MnN_x$ through nitridation. The Mn-containing cap layer 50L that is formed may have a thickness ranging from 3 nm to 20 nm, although lesser and greater thicknesses can also be employed.

Figure 3:
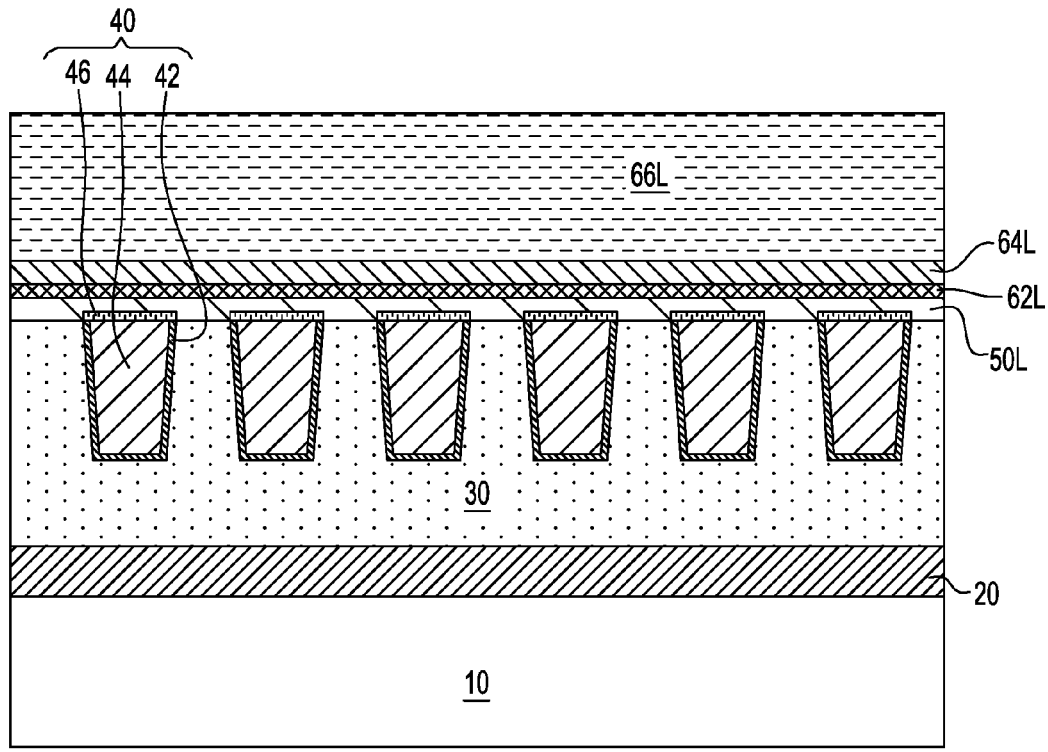
FIG. 3 is a cross-sectional view of the exemplary semiconductor structure of FIG. 2 after forming a lithographic stack including, from bottom to top, a first hard mask layer, a second hard mask layer and a photoresist layer over the Mn-containing cap layer.

Referring to FIG. 3, a tri-layer lithographic stack including, from bottom to top, a first hard mask layer 62L, a second hard mask layer 64L and a photoresist layer 66L is formed over the Mn-containing cap layer 50L.

The first hard mask layer 62L that is formed over the Mn-containing cap layer 50L may include a dielectric nitride such as, for example, silicon nitride or silicon oxynitride. The first hard mask layer 62L can be deposited by a conventional deposition process, such as CVD or PVD. The first hard mask layer 62L that is formed may have a thickness ranging from 50 nm to 200 nm, although lesser and greater thicknesses can also be employed.

The second hard mask layer 64L that is formed over the first hard mask layer 62L may be composed of a dielectric oxide such as, for example, silicon dioxide. The second hard mask layer 64L can be deposited by a conventional deposition process, such as CVD, PECVD or ALD. The second hard mask layer 64L may have a thickness ranging from 50 nm to 500 nm, although lesser and greater thicknesses can also be employed.

A photoresist layer 66L is deposited onto the second hard mask layer 64L by, for example spin coating. The photoresist layer 66L may include any conventional organic photoresist material such as, for example, methacrylates and polyesters. The photoresist layer 66L may have a thickness from 30 nm to 500 nm, although lesser and greater thicknesses can also be employed.

Figure 4:
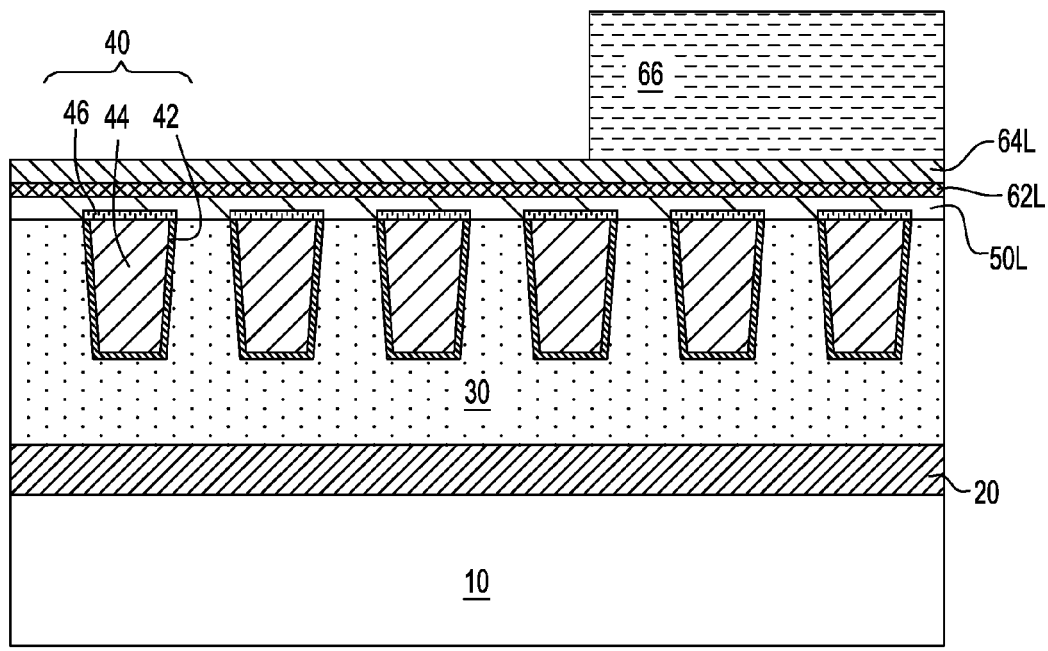
FIG. 4 is across-sectional view of the exemplary semiconductor structure of FIG. 3 after patterning the photoresist layer to provide a photoresist layer portion covering a portion of the second hard mask layer.

Referring to FIG. 4, the photoresist layer 66 is patterned to expose a first subset of the interconnects 40 between which the air gaps are to be formed. The photoresist layer 66L can be patterned by conventional lithographic exposure and development to provide a photoresist layer portion 66 atop the second hard mask layer 64L.

Figure 5:
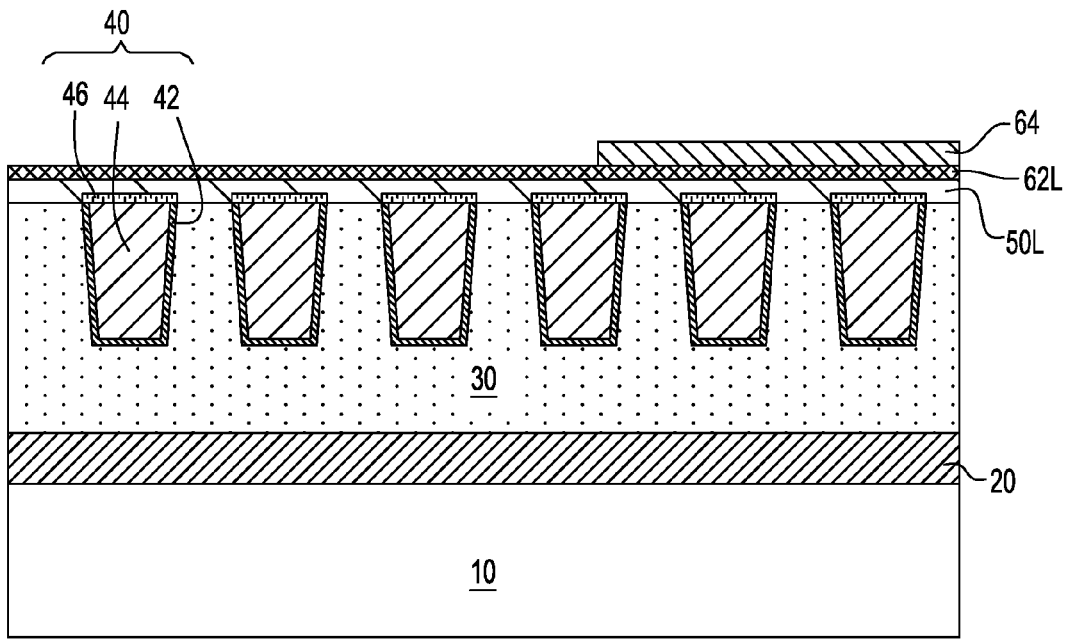
FIG. 5 is a cross-sectional view of the exemplary semiconductor structure of FIG. 4 after removing the exposed portion of the second hard mask layer to provide a second hard mask layer covering a portion of the first hard mask layer.

Referring to FIG. 5, a portion of the second hard mask layer 64L that is not covered by the photoresist layer portion 66 is removed by an anisotropic etch. The anisotropic etch can be a dry etch or a wet etch that removes the dielectric material of the second hard mask layer 64L selective to the dielectric material of the first hard mask layer 62L. The remaining portion of the second hard mask layer 64L is herein referred to as the second hard mask layer portion 64. The photoresist layer portion 66 can be subsequently removed utilizing any conventional resist stripping process such as, for example, ashing.

Figure 6:
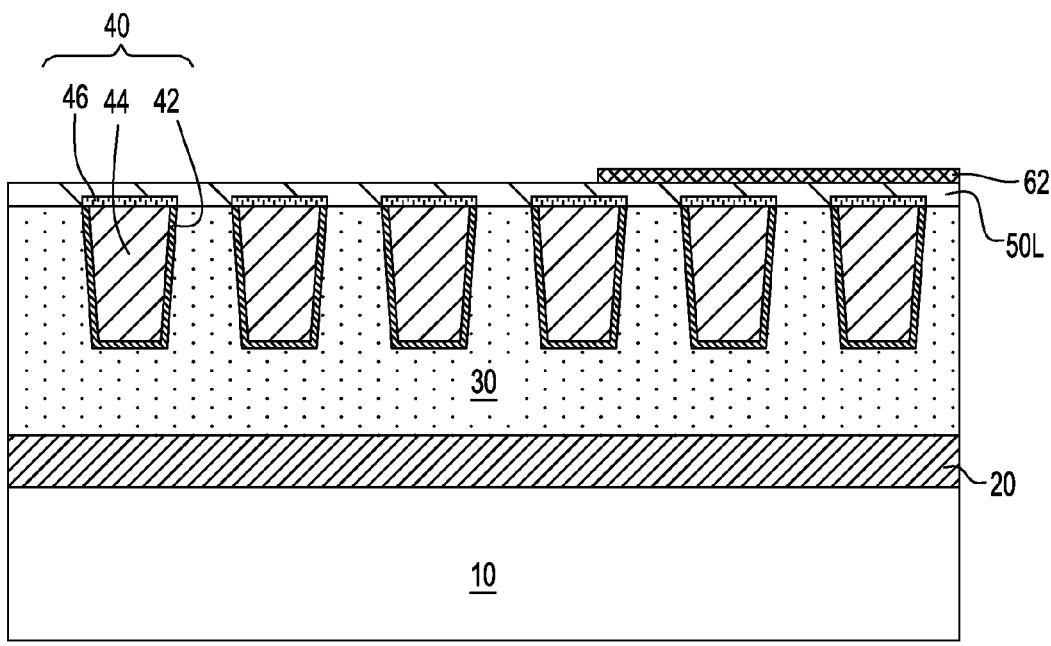
FIG. 6 is a cross-sectional view of the exemplary semiconductor structure of FIG. 5 after removing a portion of the first hard mask layer that is not covered by the second hard mask layer portion to provide a first hard mask layer portion.

Referring to FIG. 6, an anisotropic etch process is performed to remove a portion of the first hard mask layer 62L that is no longer covered by the second hard mask layer portion 64. For example, a dry etch such as RIE can be performed to remove the dielectric material of the first hard mask layer 62L selective to the Mn-containing material of the Mn-containing cap layer 50L. In the present application, to ensure that the dielectric material of the first hard mask layer 62L is completely removed from the air gap formation area, an overetch is performed. However, no erosion to the interconnects 40 occurs during the overetch since the interconnects 40 are protected by the Mn-containing cap layer 50L. The remaining portion of the first hard mask layer 62L is herein referred to as the first hard mask layer portion 62.

Figure 7:
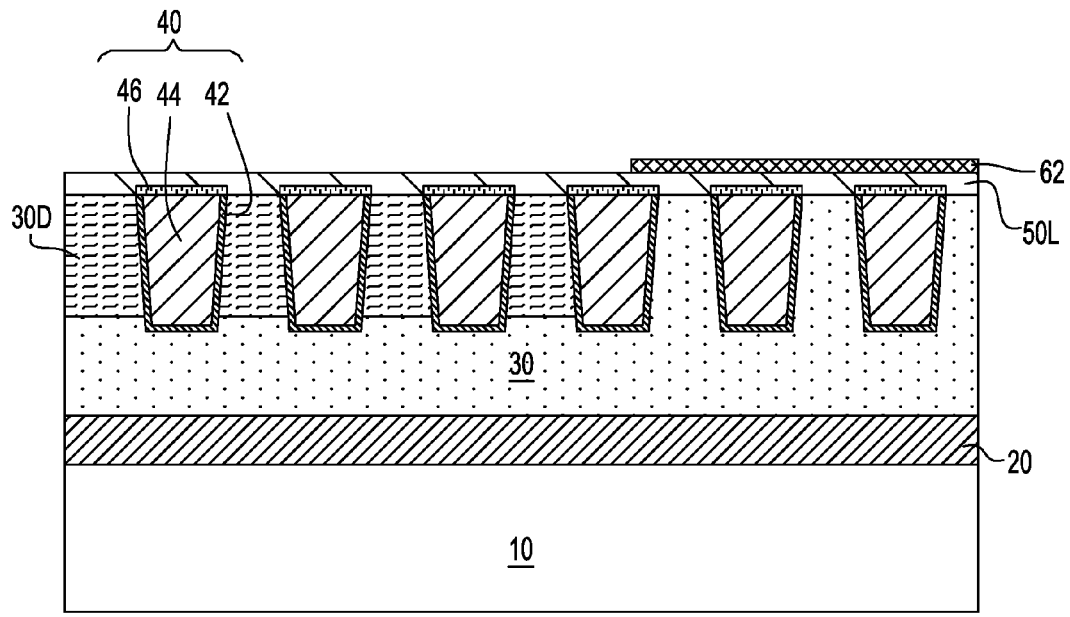
FIG. 7 is a cross-sectional view of the exemplary semiconductor structure of FIG. 6 after damaging a portion of the ILD layer that is not covered by the first hard mask layer portion.

Referring to FIG. 7, a portion of the ILD layer 30 that is not covered by the first hard mask layer portion 62 is damaged, for example, by a plasma etching process. The damage to the ILD layer 30 occurs, for example, when carbon is depleted from the ILD layer 30 by the plasma etch. In one embodiment, highly directional ions from the plasma generated with low pressure inert gases (e.g., Ar, He, $N_2$, Xe) can be used to extract carbon from the ILD layer 30. The damaged portion of the ILD layer 30 is herein referred to as a damaged ILD portion 30D. The plasma chemistries employed in the present application can penetrate through the Mn-containing cap layer 50L to damage the entire portion of the ILD layer that is not covered by the first hard mask layer portion 62, thus allowing a full gap formation between the first subset of interconnects 40 without erosion of the first subset of interconnects 40. The extent of the damage to the exposed portion of the ILD layer 30 can be controlled by varying parameters of the plasma chemistries. Typically the depth of the damaged ILD portion 30D is no greater than the height of the interconnects 40.

Figure 8:
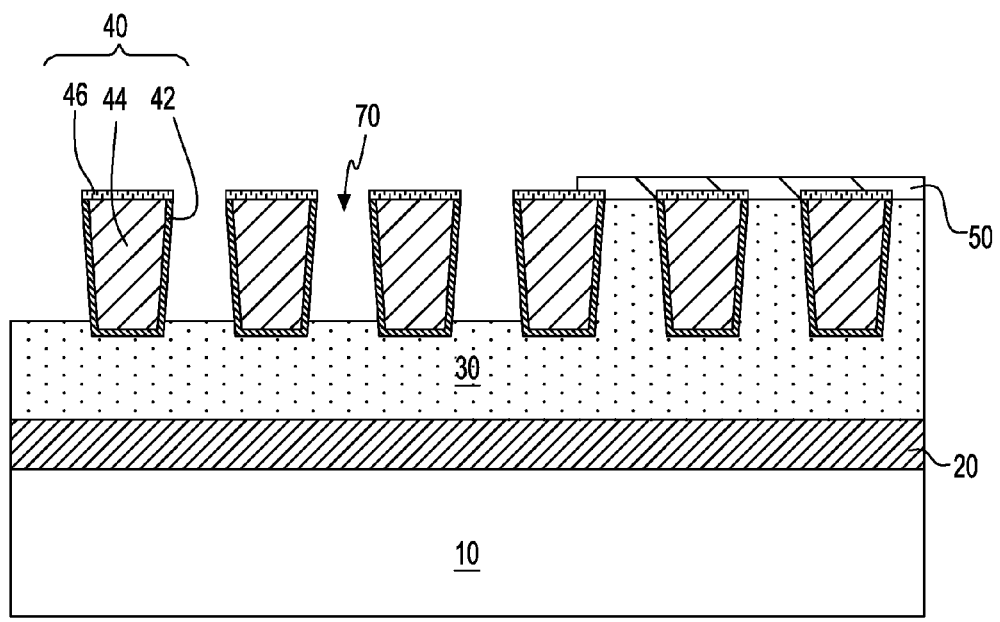
FIG. 8 is a cross-sectional view of the exemplary semiconductor structure of FIG. 7 after removing the damaged portion of the ILD layer together with a portion of the Mn-containing cap layer overlying the damage portion to form openings between the first subset of the interconnects.
Figure 9:
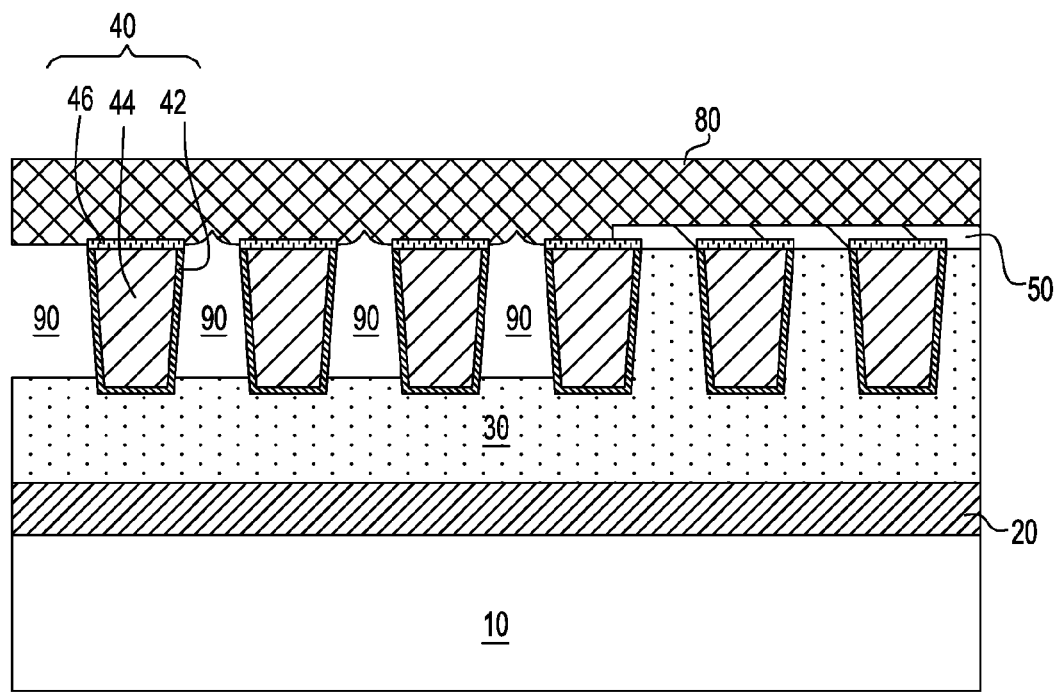
FIG. 9 is a cross-sectional view of the exemplary semiconductor structure of FIG. 8 after forming a dielectric cap layer that pinches off the openings.

Referring to FIG. 8, a wet extraction process is performed to remove the damaged ILD portion 30D from the structure, thereby forming openings 70 between the first subset of the interconnects 40. The openings 70 exposes sidewalls of the first subset of the interconnects 40. Examples of the wet chemistries that can be employed to selectively remove the damaged ILD portion 30D include, but are not limited to, diluted hydrofluoric acid (DHF) and ammonium hydroxide. In one embodiment, the damaged ILD portion 30D is removed by DHF.

The wet chemistries that selectively remove the damaged ILD portion 30D also remove a portion of the Mn-containing layer 50L overlying the damaged ILD portion 30D (i.e., the portion of the Mn-containing layer 50L that is not covered by the first hard mask layer portion 62). The portion of the Mn-containing layer 50L that remains covered by the first hard mask layer portion 62 is herein referred to as a Mn-containing layer portion 50.

After formation of openings 70 between the first subset of the interconnects 40, the first hard mask layer portion 62 may be removed by an etch, which can be a dry etch or a wet etch selective to the Mn-containing layer portion 50.

Referring to FIG. 8, a second dielectric cap layer 80 is deposited over Mn-containing layer portion 50 and the openings 70. The second dielectric cap layer 80 pinches off the openings 70 to provide air gaps 90 between the first subset of the interconnects 40. The second dielectric cap layer 80 may include a dielectric material the same as, or different from, the first dielectric cap layer 20. For example, the second dielectric cap layer 80 may include silicon nitride, silicon oxynitride, silicon carbide, SiCNH, SiCNOH or a combination thereof. The second dielectric cap layer 80 may be formed, for example, by CVD.

The air gaps 90 may be composed of a gas from the ambient air or an inert gas including $N_2$ and He. The air gaps 90 thus formed may have a dielectric constant of 1.5 or less.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a plurality of interconnects embedded in an interlevel dielectric (ILD) layer, wherein an air gap is located between adjacent interconnects in a first subset of the plurality of interconnects;
   a manganese-containing cap layer portion located over the ILD layer and a second subset of the plurality of interconnects; and
   a dielectric cap layer located over the first subset of the plurality of the interconnects and the manganese-containing cap layer portion, wherein the dielectric cap layer seals the air gap between the adjacent interconnects in the first subset of the plurality of interconnects.

2. The semiconductor structure of claim 1, wherein the manganese-containing cap layer comprises manganese nitride or manganese/manganese nitride.

3. The semiconductor structure of claim 1, wherein at least one sidewall of the interconnects in the second subset of the plurality of interconnects is laterally surrounded by the ILD layer.

4. The semiconductor structure of claim 1, wherein the ILD layer is located over a substrate.

5. The semiconductor structure of claim 1, wherein each of the plurality of interconnects comprises a diffusion barrier and a conductive structure that fills a cavity within the diffusion barrier.

6. The semiconductor structure of claim 5, wherein each of the plurality of interconnects further comprises a metal cap located on top of the diffusion barrier and the conductive structure.

7. The semiconductor structure of claim 6, wherein the metal cap comprises Co, W, Ru, Rh, Pt, or alloys thereof.

8. The semiconductor structure of claim 1, wherein a portion of the ILD layer adjoined to the manganese-containing cap layer comprises manganese silicate.

9. A method of forming a semiconductor structure comprising:
   forming a plurality of interconnects embedded in an inter-level dielectric (ILD) layer;
   forming a manganese-containing cap layer over the ILD layer and the plurality of interconnects;
   forming a first hard mask layer portion over a portion of the manganese-containing cap layer that overlies a subset of the plurality of interconnects;
   damaging a portion of the ILD layer underlying another portion of the manganese-containing cap layer that is not covered by the first hard mask layer portion;
   removing the another portion of the manganese-containing cap layer and the damaged portion of the ILD layer to form openings between the interconnects in the subset of the plurality of interconnects; and
   forming a dielectric cap layer over the openings and the portion of the manganese-containing cap layer, wherein the dielectric cap layer pinches off the openings.

10. The method of claim 9, wherein the manganese-containing cap layer comprises manganese nitride or manganese/manganese nitride.

11. The method of claim 9, wherein the ILD layer comprises dense or porous organosilicates, silsequioxanes, undoped silicate glass (USG), fluorosilicate glass (FSG), borophosphosilicate glass (BPSG), hydrogenated oxidized silicon carbon (SiCOH), carbon rich nitrogen and hydrogen doped silicon carbide (SiCNH) or silicon oxynitride (SiNO).

12. The method of claim 11, wherein the manganese in the manganese-containing cap layer reacts with the ILD layer to form a manganese silicate-containing dielectric material.

13. The method of claim 11, wherein the another portion of the manganese-containing cap layer is removed simultaneously with the damaged portion of the ILD layer.

14. The method of claim 13, wherein the another portion of the manganese-containing cap layer and the damaged portion of the ILD layer are removed by diluted hydrofluoric acid (DHF).

15. The method of claim 9, wherein the forming the plurality of interconnects comprises:
   forming a plurality of openings within the ILD layer;
   forming a diffusion barrier layer over a top surface of the ILD layer and sidewalls and bottom surfaces of the plurality of openings;
   forming a conductive material layer over the diffusion barrier layer, the conductive material layer filling the plurality of openings completely; and
   removing portions of the conductive material layer and the diffusion barrier layer from the top surface of the IMD layer.

16. The method of claim 15, further comprising forming a metal cap on top of each of the plurality of interconnects.

17. The method of claim 16, wherein the metal cap comprises Co, W, Ru, Rh, Pt, or alloys thereof.

18. The method of claim 16, wherein the metal cap is formed by a selective deposition process.

19. The method of claim 9, further comprising:
   forming a lithographic stack over the manganese-containing cap layer, wherein the lithographic stack comprises, from bottom to top, a first hard mask layer, a second hard mask layer and a photoresist layer;
   patterning the photoresist layer to expose the another portion of the manganese-containing cap layer that overlies the subset of the plurality of interconnects;
   removing a portion of the second hard mask layer that is not covered by a remaining portion of the photoresist layer;
   removing the remaining portion of the photoresist layer;

removing a portion of the first hard mask layer that is not covered by a remaining portion of the second hard mask layer to provide the first hard mask layer portion; and removing the remaining portion of the second hard mask layer.

20. The method of claim 9, further comprising removing the first hard mask layer portion after formation of the openings between the interconnects in the subset of the plurality of interconnects.

\* \* \* \* \*